United States Patent [19]

Curbelo et al.

[11] Patent Number: 5,265,039

[45] Date of Patent: * Nov. 23, 1993

[54] TECHNIQUE FOR IMPROVING THE RESOLUTION OF AN A/D CONVERTER

[75] Inventors: Raul Curbelo, Lexington; Warren R. Howell, Sherborn, both of Mass.

[73] Assignee: Bio-Rad Laboratories, Hercules, Calif.

[*] Notice: The portion of the term of this patent subsequent to Sep. 18, 2007 has been disclaimed.

[21] Appl. No.: 716,752

[22] Filed: Jun. 18, 1991

Related U.S. Application Data

[63] Continuation-in-part of Ser. No. 551,260, Jul. 11, 1990, abandoned, which is a continuation-in-part of Ser. No. 260,835, Oct. 21, 1988, Pat. No. 4,958,308.

[51] Int. Cl.$^5$ .............................................. H03M 1/20
[52] U.S. Cl. ........................................ 364/574; 341/118
[58] Field of Search ................... 364/574, 575, 576; 356/361; 324/318, 322; 341/118, 122, 131, 155

[56] References Cited

U.S. PATENT DOCUMENTS

| | | | |
|---|---|---|---|
| 4,034,191 | 7/1977 | Tomlinson et al. | 235/151.3 |
| 4,070,708 | 1/1978 | Smallcombe et al. | 364/575 |
| 4,550,309 | 10/1985 | Hiller et al. | 340/347 AD |
| 4,616,239 | 10/1986 | Abrams et al. | 364/571 |
| 4,710,747 | 12/1987 | Holland | 341/155 |
| 4,751,496 | 6/1988 | Araki et al. | 341/131 |
| 4,797,923 | 1/1989 | Clarke | 381/31 |
| 4,855,745 | 8/1989 | Smither | 341/131 |
| 4,958,308 | 9/1990 | Curbelo | 364/574 |
| 4,982,193 | 1/1991 | Saul | 341/122 |

FOREIGN PATENT DOCUMENTS

56-202949 6/1983 Japan.
PCT/US84/-
00616 4/1984 PCT Int'l Appl..

OTHER PUBLICATIONS

Mathew J. Smith et al., "Step Scan Interferometry in the Mid-Infrared with Photothermal Detection", *Applied Spectroscopy*, vol. 42, No. 4, 1988, pp. 546–555.

*Primary Examiner*—Thomas G. Black
*Assistant Examiner*—Michael Zanelli
*Attorney, Agent, or Firm*—Townsend and Townsend Khourie and Crew

[57] ABSTRACT

A technique for improving the resolution of an A/D converter (30). The input analog signal is sampled to generate an analog level and the analog level is held (20) for an interval. A dither signal (22) is superimposed (23) on the held level to generate a fluctuating voltage. This fluctuating voltage is then sampled (25) a plurality of at least N times, and N sampled values are communicated to the A/D converter (30) so that N digitized values are generated. These digitized values are averaged (32) to provide an output having a digitization error reduced by a factor of up to $N^{\frac{1}{2}}$.

47 Claims, 5 Drawing Sheets

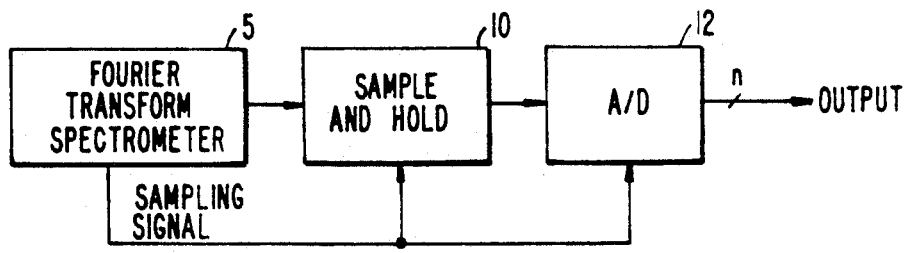
FIG._1. (PRIOR ART)
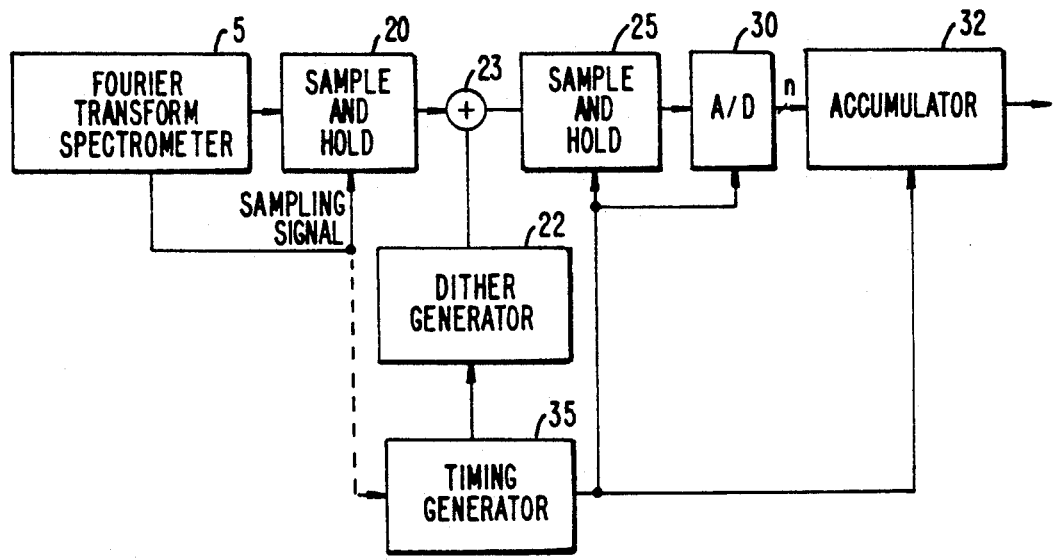
FIG._2A.
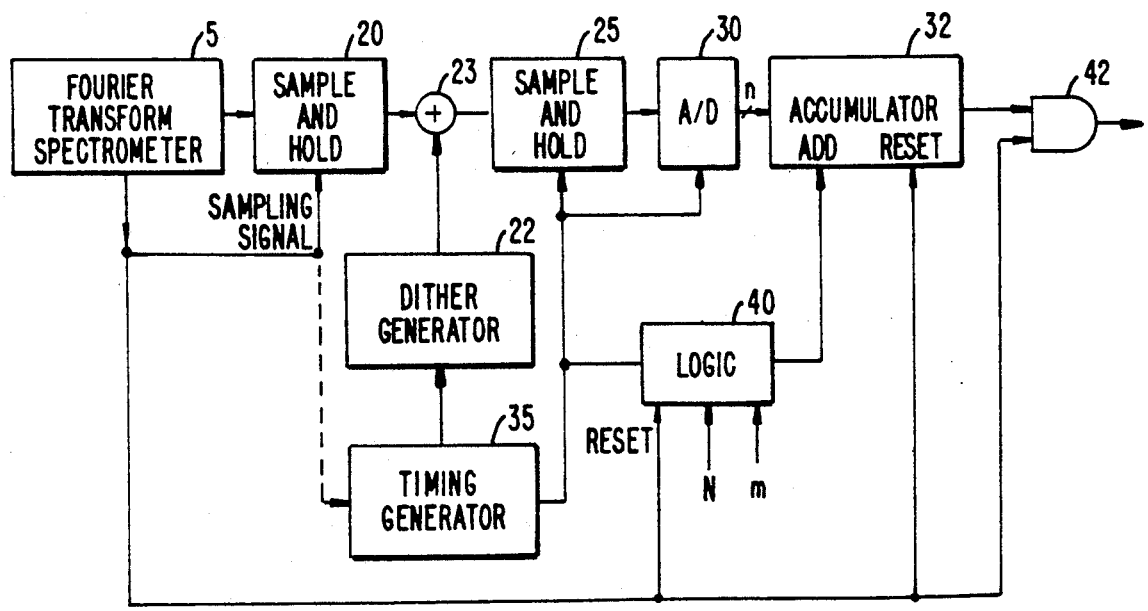
FIG._2B.

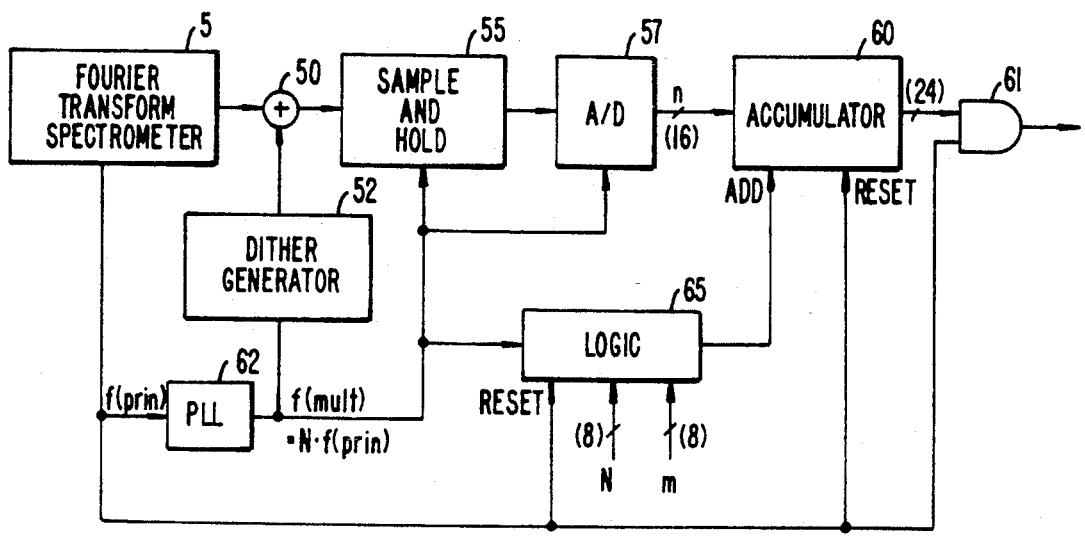
FIG._3.
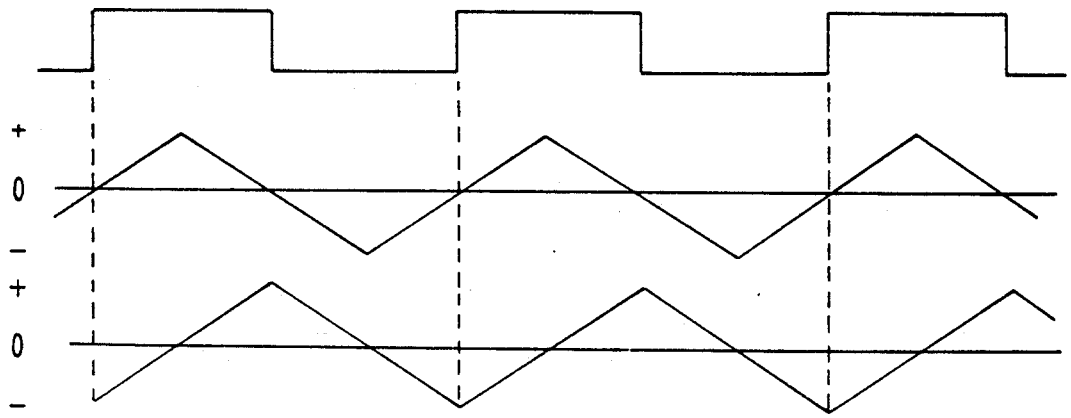
FIG._4.
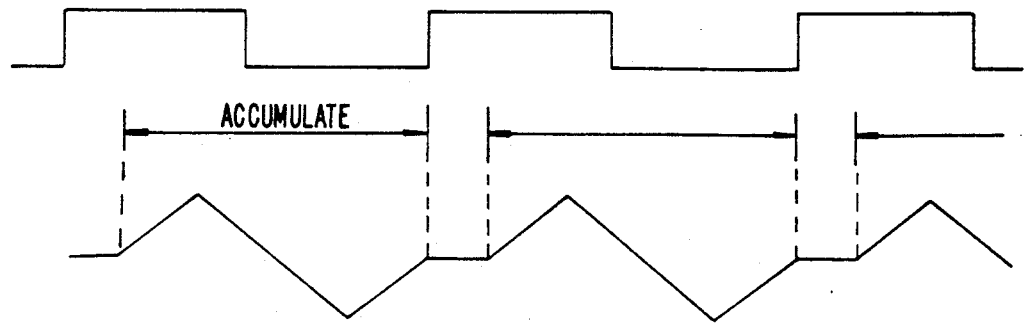
FIG._5.

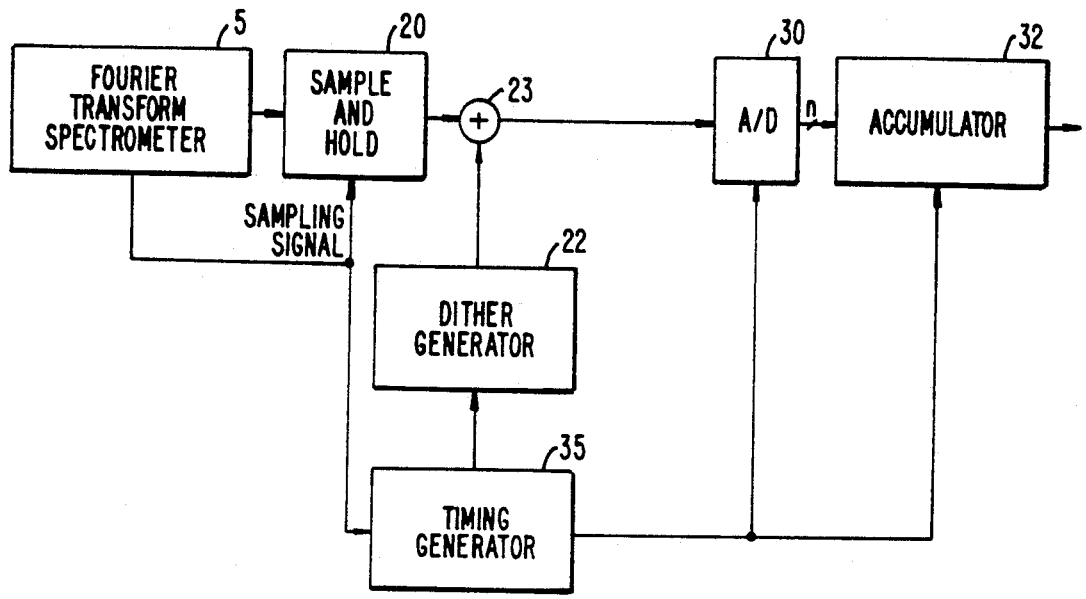
FIG._6A.
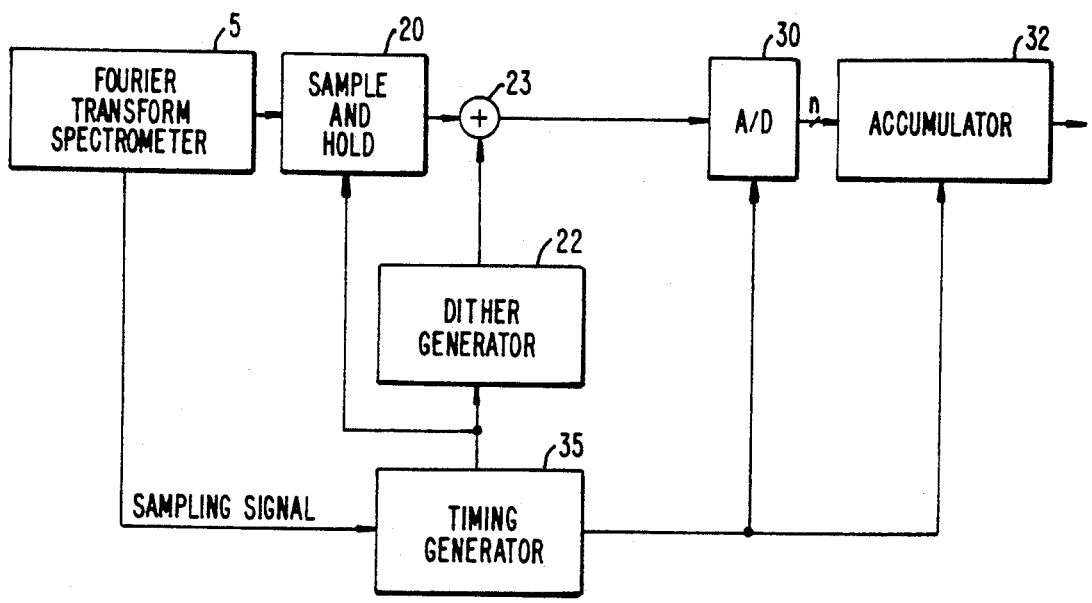
FIG._6B.

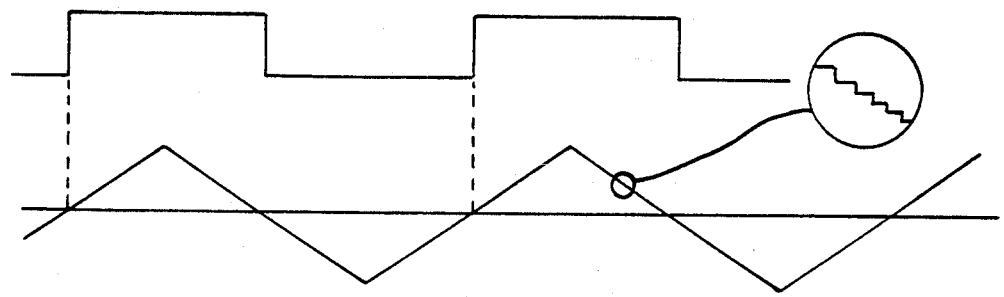
FIG._6C.
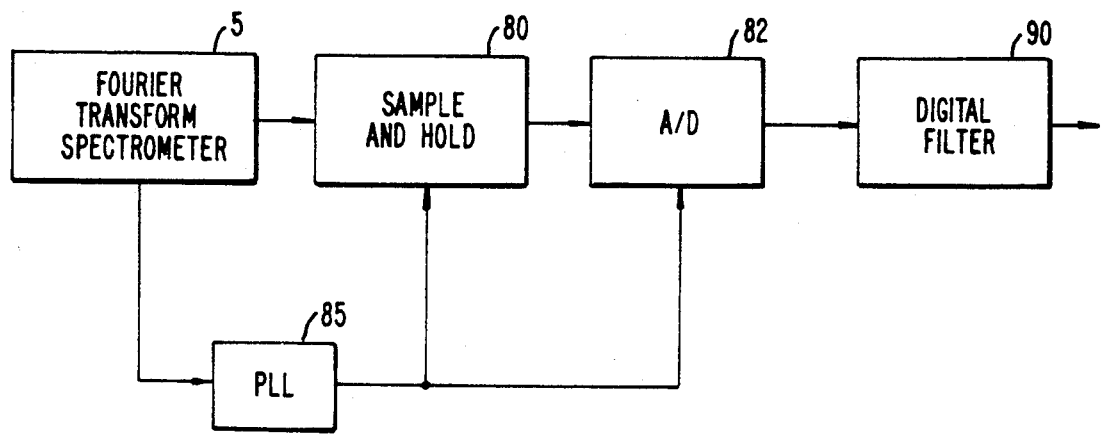
FIG._7.

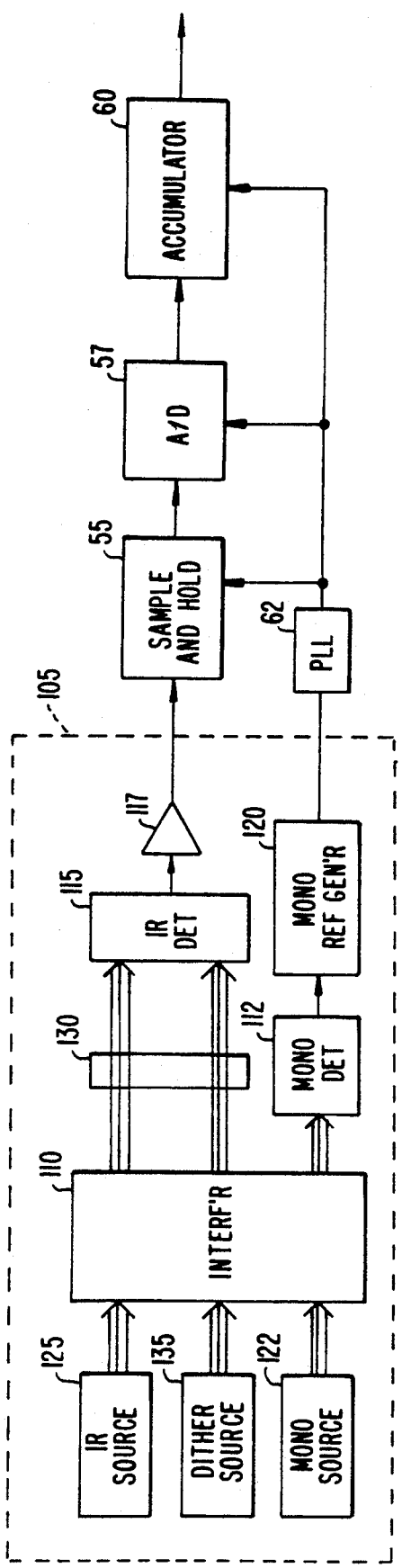
FIG._8A.
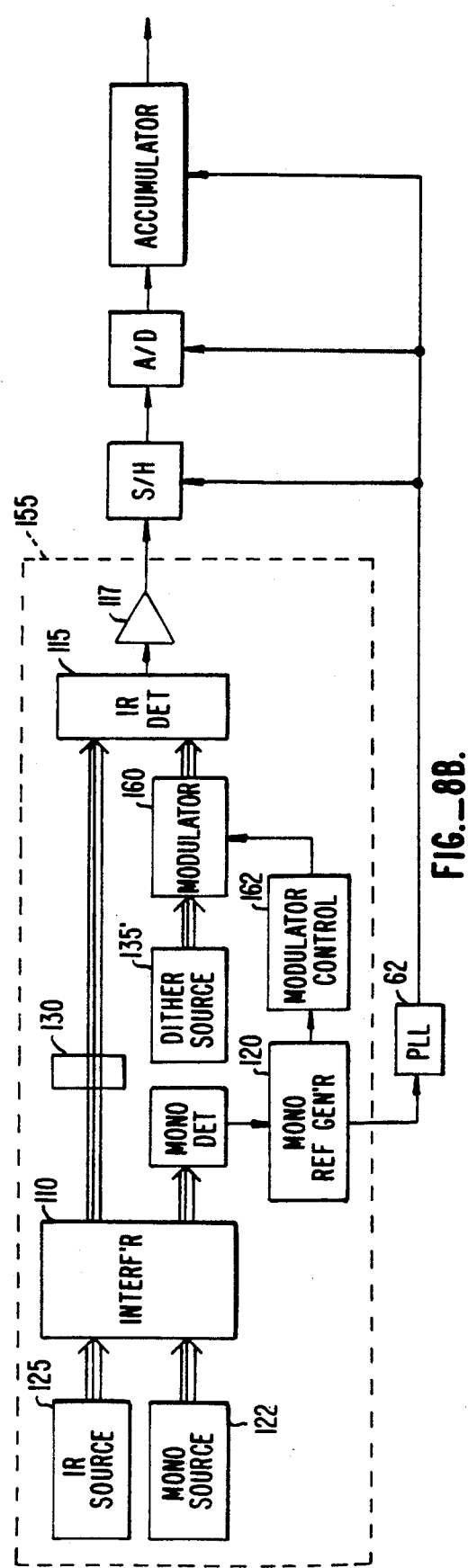
FIG._8B.

TECHNIQUE FOR IMPROVING THE RESOLUTION OF AN A/D CONVERTER

This application is a continuation-in-part of application Ser. No. 07/551,260, filed Jul. 11, 1990, now abandoned, which is itself a continuation-in-part of application Ser. No. 07/260,835, filed Oct. 21, 1988, now U.S. Pat. No. 4,958,308.

BACKGROUND OF THE INVENTION

The present invention relates generally to signal processing, and more specifically to circuitry for improving the resolution of an analog-to-digital converter (A/D converter).

A/D converters are well known devices for providing a digital representation of an analog voltage presented at the A/D input. Typical A/D converters provide a 16-bit resolution for a single conversion, but this is not fundamental. However, depending upon the number of bits resolution provided by the A/D converter in any single conversion, the resolution is limited.

Certain classes of input signal that must be digitized are characterized by a high ratio between maximum and minimum values. An example is the signal from a Fourier transform spectrometer where it is often the case that the amount of input radiation that the spectrometer can accommodate is limited by the dynamic range of the A/D converter.

A Fourier transform spectrometer typically includes an interferometer into which an infrared beam to be analyzed and a monochromatic reference beam are directed. The interferometer includes a mechanism for each input beam to be split into two or more beam components. The beam components travel separate paths and are then recombined so as to interfere with each other. An optical element in one of the paths is scanned over a range of positions to vary the path length of one beam component relative to that of the other. The maximum excursion from zero path difference determines the maximum resolution of the spectral measurement.

There are many kinds of interferometers, but the most commonly used type for Fourier transform spectrometers is a Michelson interferometer. The interferometer has a fixed mirror and a movable mirror, and may be operated in a rapid scan mode or a step scan mode. In a rapid scan interferometer the mirror is driven at a nominally constant velocity over a portion of its travel. In a step scan interferometer, the movable mirror is moved in small increments and stopped for each measurement.

Each of the input beams is split at a beam splitter with one portion traveling a path that causes it to reflect from the fixed mirror and another portion traveling a path that causes it to reflect from the movable mirror. The portions of each beam recombine at the beam splitter, and due to optical interference between the two portions, the intensity of the monochromatic beam and each frequency component of the infrared beam are modulated as the mirror moves. For constant mirror velocity, the frequency for a particular component is proportional to the component's optical frequency and the mirror velocity. The recombined beams are directed to appropriate detectors.

The detector output represents the superposition of these modulated components, and when sampled at equal increments of mirror movement, provides an interferogram whose Fourier transform yields the desired spectrum. All these modulated components are in phase when the two paths are equal, and the resultant superposition produces a relatively huge peak in intensity, referred to as the centerburst.

The signal to noise (S/N) ratio in the interferogram is very high compared to the S/N ratio in the associated spectrum. This is because the signal contributions from the individual spectral resolution elements add linearly at the centerburst while the noise contributions add as the square root of the sum of the squares.

The monochromatic beam provides a nominally sinusoidal reference signal whose zero crossings occur each time the moving mirror travels an additional one quarter of the reference wavelength. A pulsed sampling signal is derived from the sinusoidal signal, typically from the zero crossings, and is used to trigger the data acquisition electronics to provide regularly sampled values for the interferogram. With the appropriate choice of mirror velocity, the output signal can be made to fall within a convenient range of modulation frequencies, as for example in the audio range.

The frequency of the sampling signal is referred to as the principal sampling frequency and is designated f(prin). The inverse of the principal sampling frequency is referred to as the principal sampling interval. Depending on the spectral range of interest, the sampling interval may be the distance between adjacent zero crossings of the sinusoidal signal, or may be a multiple of that distance.

The mirror velocity may be controlled and rendered substantially constant by generating a reference signal at the desired frequency f(prin) by frequency division of a signal from a crystal oscillator, and providing servo control of the mirror motion so the monochromatic signal tracks the reference signal. For a highly uniform mirror velocity, the time duration of a sampling interval (which is a constant unit of distance related to the wavelength of the monochromatic reference beam) is very nearly constant. Therefore, it is not uncommon for those in the art to use time and distance somewhat interchangeably.

Additionally, it is common to exclude data points (or not take them) for those portions of the mirror travel (typically a fraction of a millimeter) where the mirror's motion is being reversed. Thus the term "scan" should be understood generally to refer to the portion of the mirror's travel where data points are taken and used for the spectral measurement. Moreover, data acquisition typically occurs for only one direction of mirror movement.

FIG. 1 shows a prior art circuit for digitizing the analog spectrometer signal. For present purposes, the interferometer, detector, detector amplifiers, and filters as appropriate are shown as a block labeled Fourier transform spectrometer 5. It should be understood that the complete spectrometer system typically further includes the illustrated circuitry as well as various control circuits and a dedicated computer (not shown).

The analog signal from Fourier transform spectrometer 5 is communicated to the voltage input of a sample and hold (S/H) circuit 10, which provides a constant voltage level at its output when clocked by a sampling signal (at f(prin)) at its sampling input. This level is held until the A/D conversion is completed. This voltage level is communicated to an analog-to-digital A/D converter 12, which is also clocked by the sampling signal. Assuming A/D converter 12 to have an n-bit output (n=16 is typical), the characteristic resolution is one part in $2^n$. For a 16-bit A/D converter and analog input signals covering ±10 volts, the digitization increment is about 0.3 mv.

The output from the A/D converter is communicated to the dedicated computer where it is stored until all the data points in the interferogram have been acquired. The interferogram is then subjected to processing steps including a fast Fourier transform (FFT) to convert it into a spectrum. In some instances, multiple scans are made and the resultant interferograms are averaged before the FFT. For the averaging to provide a statistical improvement (increased S/N ratio), a given point on the interferogram should fall on a different part of the A/D converter's range. This will normally be the case since standard practice is to set up the spectrometer so that the noise spans at least a few digitizing increments.

In many cases, the resolution of the A/D converter sets the maximum S/N ratio that can be achieved in the spectrum in any one scan. This limitation can be partially, but not completely overcome by using a technique known as gain ranging. This technique entails increasing (for example, by a factor of 16) the analog voltage that is input to the S/H circuit and A/D converter when the mirror is away from the vicinity of the centerburst position.

SUMMARY OF THE INVENTION

The present invention provides a technique for improving the resolution of an A/D converter to enable the measurement of signals having a high dynamic range, as in connection with sampling and digitizing the analog output signal from a Fourier transform spectrometer.

An analog signal to be digitized is combined with a dither signal, the resultant dithered signal is then sampled a plurality of times, and at least some of the sampled values are digitized (by the A/D converter). At least some of the digitized values are co-added (in effect averaged) to provide an output having a digitization error reduced by a factor of up to the square root of the number of values averaged. The technique is typically carried out with a high speed A/D converter so that a large number of samples of the fluctuating voltage can be digitized within a given sampling interval.

The dither may be random or pseudorandom noise, or may be a regular waveform such as a triangular wave. In the spectrometer context, it is preferred that the spectral content of the dither not overlap or fold back into the spectral region of interest.

According to a first embodiment, the spectrometer output signal is sampled and held at the principal sampling frequency. Each sampled and held level has the dither superimposed on it and is sampled a plurality of times, and at least some of the values are digitized and averaged as described above.

According to a second embodiment, the spectrometer output signal has the dither superimposed on it, and the resultant signal is then sampled and held at a frequency that is a multiple of the principal sampling frequency. A plurality of the sampled values within each principal sampling interval are digitized and averaged as described above.

A third embodiment is similar to the first except that the dither signal has a time profile characterized by a plurality of rectangular pulses, each of a width sufficient to allow the summed signal to be directly digitized by the A/D converter without a second S/H circuit. The pulses may be contiguous to define a stepped, possibly regular, waveform, or may be spaced apart.

A fourth embodiment is similar to the second except that a separate dither generator is not used. Rather, the bandwidth of the signal channel is increased by a significant factor (say 10 or greater) beyond the spectral range of interest, and noise from the detector or amplifiers is included along with the detector signal.

A fifth embodiment is similar to the second except that the dither signal is generated optically. In a first variation of this embodiment, light from a narrow band source, preferably having a spectrum outside the spectral range of interest, is introduced into the interferometer along with the source of analytical radiation (typically broadband infrared). The narrow band source should be sufficiently narrow to provide modulation over the entire scan with minimal apodization. A laser or a spectral line would be suitable.

The interferometer modulates light from both sources, and the modulated beams are communicated to the detector. The resultant signal thus includes a component resulting from the modulation of the narrow band beam. In a second variation of this embodiment, a light source is modulated by a mechanism separate from the interferometer, such as a chopper, and the modulated light is caused to impinge on the detector.

The present invention, by reducing the digitization error, and thereby increasing the dynamic range, allows the use of greater source energy in the spectrometer without reducing sensitivity or requiring an A/D converter having more bits of resolution. A further advantage of the invention is that it tends to average out non-uniformities in the A/D converter step size (digitizing increment), which further enhances the accuracy of the measurement.

A further understanding of the nature and advantages of the present invention may be realized by reference to the remaining portions of the specification and the attached drawings.

BRIEF DESCRIPTION OF THE DRAWINGS

FIG. 1 (described above) is a block diagram of prior art circuitry for providing digitized values corresponding to the signal from a Fourier transform spectrometer;

FIGS. 2A and 2B are block diagrams illustrating a first embodiment of circuitry according to the present invention for increasing the effective resolution of an A/D converter used to digitize the signal from a Fourier transform spectrometer; and FIG. 3 is a block diagram of a second embodiment of circuitry according to the present invention.

FIGS. 4 and 5 illustrate suitable waveforms for the dither signal used with the first and second embodiments.

FIGS. 6A and 6B are block diagrams of a third embodiment of circuitry according to the present invention;

FIG. 6C illustrates a suitable waveform for the dither signal for the embodiment of FIGS. 6A and 6B;

FIG. 7 is a block diagram illustrating a fourth embodiment of circuitry according to the present invention; and FIGS. 8A and 8B are block diagrams illustrating a fifth embodiment according to the present invention.

DESCRIPTION OF SPECIFIC EMBODIMENTS

Introduction

The present invention provides improved apparatus and method for generating a digital representation of a time-varying analog signal, and will be described in the context of digitizing the analog signal from a Fourier transform spectrometer (referred to as the spectrometer output signal). Except as otherwise stated, it will be assumed that the spectrometer is generally as described above, and may include a gain ranging amplifier.

First Embodiment

FIG. 2A is a block diagram of circuitry according to a first embodiment of the present invention. The analog signal from spectrometer 5 is communicated to a first sample and hold (S/H) circuit 20, which is clocked by the sampling signal at f(prin) from the monochromatic reference system. S/H circuit 20 provides a DC level corresponding to the value of the voltage of the input signal at the time of each sampling.

A dither generator 22 generates a dither signal whose characteristics will be described below. The dither is superimposed on the output from S/H circuit 20 at a summing node 23. The resulting fluctuating voltage is communicated to the input of a second S/H circuit 25, the held level of which is communicated to the input of an analog to digital (A/D) converter 30. The A/D converter's n-bit digital output is communicated to an accumulator 32, which communicates with a computer interface (not shown).

A timing generator 35 clocks S/H circuit 25, A/D converter 30, and accumulator 32. Timing generator 35 runs at a frequency typically one or more orders of magnitude above the frequency of the sampling signal f(prin). Accordingly, for each value of output voltage held by S/H circuit 20, a plurality of held levels are generated by S/H circuit 25. The output levels from S/H circuit 25 are digitized by A/D converter 30 and communicated to accumulator 32. Accumulator 32 co-adds the digital outputs from A/D converter 30, and outputs a single value. Assuming that the same number of digitized samples are co-added every time, the output from the accumulator is equivalent to the average value, differing only by an overall scale factor.

The sampling signal's communication with timing generator 35 is shown in phantom. This is because timing generator 35 may be synchronous (in which case the sampling signal would define the clock rate), or it may be asynchronous. In a typical application (synchronous or asynchronous), timing generator 35 may be run at a frequency of 10-300 times the frequency of the principal sampling signal. S/H circuit 25, A/D converter 30, or accumulator 32 may be gated so that a smaller number (say 8-256) of digitizations are co-added. These numerical ranges are merely representative. Co-adding as few as 2-4 digitizations provides a meaningful improvement.

The circuit components are generally off-the-shelf items. The S/H circuits may be modules, integrated circuits, or (in the case of S/H circuit 25) circuitry incorporated into the front end of A/D converter 30. Summing node 23 may be an operational amplifier. A high-speed A/D converter capable of operation at 500 kHz is available from Analogic, Woburn, Mass. Accumulator 32 may be a separate hardware device or may be implemented in software as part of the dedicated computer.

For a rapid scan system, timing generator 35 may comprise a phase locked loop for generating a signal at a frequency that is defined multiple of f(prin). Alternatively a signal at a frequency higher than f(prin) can be derived from the same crystal oscillator that is used to generate the reference signal that provides the servo control for the mirror drive, but using a smaller frequency division factor. A step scanning system is normally driven off a clock.

If N is the number of digital outputs that are co-added, the result is a resolution increased by a factor of up to $N^{\frac{1}{2}}$ relative to the resolution obtainable from a single digitization of A/D converter 30. This benefit can be exploited by increasing the input radiation power level to increase the detector signal level relative to the noise. The A/D converter must still accommodate the increased signal, which can be achieved by reducing the gain in the signal channel or providing an S/H circuit and A/D converter capable of accepting a larger range of input voltages. More generally, the invention's benefit can be exploited by relieving other constraints that were imposed by the dynamic range limitations of the A/D converter.

In addition to the increased resolution, the dither signal has the effect of averaging out possible local non-uniformities in the A/D converter step size (digitizing increment).

There is no requirement that accumulator 32 co-add all digitized values from A/D converter 25, that the A/D converter digitize all values from S/H circuit 25, or that S/H circuit 25 sample over the entire principal sampling interval. Indeed, any one or more of these circuit elements may be gated so that only values of the fluctuating voltage occurring during a portion of the principal sampling interval contribute to the co-added result.

FIG. 2B shows a specific example incorporating circuitry for gating accumulator 32. In this case, the signal from timing generator 35 clocks S/H circuit 25 and A/D converter 30, but is communicated to a logic circuit 40.

Logic circuit 40 represents one way of gating the circuitry so that fewer than all possible values are co-added. Logic circuit 40 is responsive to a binary code representative of the maximum number, N, of values that can be co-added and a binary code representative of a number m which is less than or equal to N. The principal sampling signal is communicated to a reset input on logic circuit 40, a reset input on accumulator 32, and a control input of a gate network 42. Logic circuit 40, upon receiving a reset pulse from the principal sampling signal, counts upwards to block the first m pulses of the signal from timing generator 35, and then passes the remaining pulses in order to cause accumulator 32 to co-add only those values from the A/D converter after the first m have been ignored.

If $m=0$, N digitized values are co-added and the A/D output has its resolution increased by a factor of up to $N^{\frac{1}{2}}$. For example, if $m=0$ and $N=256$, the accumulator output resulting from averaging 16-bit outputs has an effective resolution of up to 20 bits. If $N=1$, the accumulator only acts to buffer the A/D output.

Second Embodiment

FIG. 3 is a block diagram of circuitry according to a second embodiment of the present invention. This embodiment is shown incorporating gating circuitry as shown in FIG. 2B. This embodiment differs from the embodiment of FIGS. 2A and 2B in that the signal from the spectrometer has the dither directly superimposed on it prior to being sampled and held. More particularly, the analog spectrometer signal is communicated to a summing node 50 as is the output from a dither generator 52. The resulting voltage is communicated to the input of an S/H circuit 55, the held level of which is communicated to the input of an A/D converter 57. The A/D converter's n-bit digital output is communicated to an accumulator 60. The accumulator output is communicated to the data inputs of a gate network 61, the output of which communicates with the computer interface.

A timing generator, shown as a phase locked loop 62, generates a signal at a frequency f(mult) that is a multiple of the principal sampling frequency f(mult)=N.f(prin). The signals at f(prin) and f(mult) should be phase locked to avoid spurious effects. The signal at f(mult) is used to clock S/H circuit 55 and A/D converter 57, and is also communicated to a logic circuit 65 whose operation is as described above in connection with FIG. 2B.

The embodiment of FIG. 3 has the advantage over that of FIGS. 2A and 2B in that it requires only a single sample and hold circuit. Possibly offsetting that benefit is that the output is an integrated signal which has the effect of multiplying the spectrum by a factor $F=(\sin x)/x$, where $x=\pi f/f(prin)$. Therefore, $F=1$ for $f=0$ and $F=0$ for $f=f(prin)$. However, since the spectrum only contains frequencies below $f(prin)/2$, the factor F ranges from 1.0 to $2/\pi$ (approximately 0.6), which is a relatively small correction factor to take care of.

Dither Signal Characteristics

The dither may be a random or pseudorandom signal or it may have a regular waveform such as a triangular wave. If the dither signal is random, the randomness may be derived from the thermal noise from a diode.

If the dither signal has a non-zero time average, the result is a constant offset to the interferogram. This is not a problem since the Fourier transform maps this offset to zero frequency. In any event, the data processing software will often remove the average value from the interferogram before performing the FFT.

The dither signal spectrum should not overlap with the spectral range of interest.

It will be appreciated that when a signal is sample at a constant frequency, frequency components above one-half the sampling frequency fold back into the range below one-half the sampling frequency. Thus a statement that a frequency is outside a range of interest should be taken to mean that the frequency also does not fold back into the range of interest after sampling. For example, if the principal sampling frequency (in wave number units) is about 16,000 cm$^{-1}$, corresponding to a laser wavelength of 0.6328 microns, the spectral range that can be measured is theoretically (Nyquist's theorem) about 0-8000 cm$^{-1}$, and practically about 10 cm$^{-1}$ to 7000 cm$^{-1}$. Accordingly, the dither can be put in a range of 7000-9000 cm$^{-1}$ (the signal power in the range 8000-9000 cm$^{-1}$ folds back to the range 7000-8000 cm$^{-1}$). Alternatively, the dither can be put in the range between 0 and the smallest wavenumber in the practical range of operation (say 10 cm$^{-1}$).

The above condition on the dither signal spectrum is not absolute. To the extent that the dither signal is a periodic waveform containing discrete frequency components, it could be allowed to overlap or fold into the spectral range of interest. It would appear as one or more spikes in the spectrum, that could be removed by software. However, since it is usually easy to locate the dither outside the spectral range of interest, it is preferred to do so.

The dither signal should be characterized by an amplitude that spans at least a few digitizing increments. A factor of 5-20 is generally appropriate. Therefore, where the digitizing increment is about 0.3 mv, the dither amplitude should be a few to several millivolts. It is beneficial to use a larger dither amplitude, which has the effect of reducing systematic errors in the A/D converter.

When multiple interferometer scans are to be taken, the dither signal can be varied from scan to scan. This can be accomplished by varying the dither signal's phase or waveform randomly or pseudorandomly from scan to scan. This tends to be most beneficial when the number of scans to be co-added is large relative to the number of digitized values averaged for each sampling interval in each scan.

FIGS. 4 and 5 are timing diagrams illustrating the use of a non-random dither signal, both for the case where all values generated during the principal sampling period are co-added and for the case where one or more of S/H circuit 25 (or 55), A/D converter 30 (or 57), or accumulator 32 (or 60) are gated to limit the number of values that contribute to the co-added measurement.

FIG. 4 is a timing diagram illustrating suitable dither signals for the case where values generated over the entire principal sampling interval are co-added. The square wave defines the principal sampling period. The dither signals are triangular waves (shown centered at zero, but this is not necessary) with a period equal to the principal sampling interval. The phase is largely insignificant, and two possibilities are illustrated.

FIG. 5 is a timing diagram illustrating the case where the values generated over only part of the principal sampling interval are co-added. In the specific example shown, potential values from the initial part of the principal sampling interval are excluded from the accumulator, so that the effective sampling interval is shorter. The dither signal is a series of triangular wave segments, each having a period equal to the effective sampling interval, but repeated at intervals equal to the principal sampling interval.

The waveforms shown in FIGS. 4 and 5 have the same period as the principal sampling signal, and thus contain components at the sampling frequency and its harmonics. All these frequency components fold to zero frequency in the output spectrum.

Third Embodiment

FIG. 6A is a block diagram of circuitry according to a third embodiment of the present invention. This embodiment corresponds to the first embodiment, illustrated in FIG. 2, and corresponding reference numerals are used. This embodiment lacks a second S/H circuit, corresponding to S/H circuit 25 in FIG. 2. The purpose of S/H circuit 25 is to hold the fluctuating voltage long enough for A/D converter 30 to perform the actual conversion. The third embodiment eliminates the need for the second S/H by use of a dither signal having a particular characteristic.

FIG. 6B shows a variant of the third embodiment where S/H circuit 20 is clocked by timing generator 35 rather than the principal sampling signal. This may be preferred where the S/H circuit is not capable of holding the voltage level for an entire principal sampling interval. This could be the case where the S/H circuit and A/D converter are packaged in a single module (with access to add the dither), and the S/H isn't intended to be clocked much less frequently than the A/D converter.

FIG. 6C is a timing diagram illustrating a dither signal wave form suitable for the third embodiment. Specifically, the dither signal has a waveform characterized by steps having a width corresponding to the intervals at which the A/D converter is clocked. Thus each step is longer in duration than the interval during which the A/D converter does its conversion and proper A/D conversion can occur. This is shown in the specific context of a triangular wave where the steps are uniform in height and contiguous. Other possibilities include rectangular pulses of random height, but constant width. The pulses could be spaced from each other so long as they occur synchronously with respect to the clocking of the A/D converter.

Fourth Embodiment

FIG. 7 is a block diagram of circuitry according to a fourth embodiment of the present invention. This embodiment corresponds generally to the second embodiment, illustrated in FIG. 3, but differs primarily in that there is no separate dither generator. Assume that the maximum frequency of interest is $F_{max}$ (in appropriate units). The signal channel bandwidth is increased by a significant factor to include detector and/or amplifier noise up to a maximum frequency of $MF_{max}$.

Assuming white noise, the noise is increased by a factor of the square root of the bandwidth expansion factor. The gain can be reduced by this factor, and the total noise will still span a few digitizing increments, notwithstanding the fact that the noise in the range up to $F_{max}$ is less than a digitizing increment. With this reduction in gain, the input radiation to the spectrometer can be increased. A bandwidth expansion corresponding to $M \geq 10$ is typically suitable.

To effectively sample the spectral range between 0 and $F_{max}$, the sampling frequency must be at least $2F_{max}$. However, in order that the noise between $F_{max}$ and $MF_{max}$ not fold into the range between 0 and $F_{max}$, the sampling frequency must exceed $(M+1)F_{max}$. This would cause the noise between $(M+1)F_{max}/2$ and $MF_{max}$ to fold into the range between $F_{max}$ and $(M+1)F_{max}/2$, keeping it out of the range between 0 and $F_{max}$, which is the range of interest.

A Fourier transform spectrometer 5, having the bandwidth-expanded signal channel communicates its output signal to the input of an S/H circuit 80, the held level of which is communicated to the input of an A/D converter 82. A phase locked loop 85 generates a signal at a multiple of the principal sampling frequency f(prin) that is at least as high as $(M+1)F_{max}/2$. The digitized values from A/D converter 82 are communicated to a digital filter 90. Normally, digital filter 90 is not a separate unit, but is inherently part of the FFT software. However, for certain instances where it is desired to avoid doing the FFT with so large a number of data points, a separate hardware or software digital filter can be used. In such a case, the output of the digital filter would be the interferogram with a frequency content up to $F_{max}$.

Fifth Embodiment

FIGS. 8A and 8B are block diagrams showing optical components and circuitry according to two variants of a fifth embodiment of the present invention. This embodiment corresponds generally to the second embodiment, illustrated in FIG. 3, and reference numerals corresponding to those in FIG. 3 are used where appropriate. The Figures show S/H circuit 55, A/D converter 57, and accumulator 60. For ease of illustration, the circuitry for gating the accumulator is not shown. This embodiment differs primarily in that the dither is generated optically rather than electrically. In brief, a chopped or otherwise modulated auxiliary beam of light is directed to the infrared detector, along with the analytical (infrared) beam that has been modulated by the interferometer.

The resultant spectrometer output signal thus includes a first voltage component corresponding to the intensity of the modulated analytical radiation and a second voltage component corresponding to the intensity of the modulated auxiliary beam. The components combine linearly, but possibly with unequal weights, depending on the detector's sensitivity for the different beams.

The intensity and time profile of the modulated auxiliary source should provide a voltage component that meets the characteristics for the dither signal described above. Thus the light intensity should be such that the voltage component assumes values over a range of a few to many digitizing increments. The frequency content of the voltage component is preferably outside the spectral region of interest.

The spectrometer, designated 105 in FIG. 8A and 155 in FIG. 8B, includes, in accordance with known practice, an interferometer 110, a monochromatic detector 112, an infrared detector 115 with associated amplifier 117, and reference generating circuitry 120 coupled to detector 112 for generating the monochromatic reference signal. A monochromatic reference beam from a source 122 and a beam of analytical radiation (typically infrared) from a source 125 are input to the interferometer. A sample 130 is normally placed in the infrared beam between the interferometer and detector 115, although it is possible to place the sample between the source and the interferometer. The above-described elements constitute what was shown as Fourier transform spectrometer 5 in FIGS. 1, 2A, 2B, 3, 6A, and 6B, with the signal from amplifier 117 being the spectrometer signal and the signal from circuitry 120 being the sampling signal.

In accordance with the variation of FIG. 8A, a beam from a narrow band source 135, referred to as the dither source, is also directed into the interferometer. The dither source has a wavelength preferably outside the spectral range of interest but within the range capable of detection by infrared detector 115. For example a YAG laser operating at 1.06 microns would be suitable for mid-infrared measurements. The interferometer modules all three beams. The modulated monochromatic beam is directed to the monochromatic detector 112, which is provided with a filter 140 to ensure that it receives only the monochromatic reference beam. The modulated beams from infrared source 125 and dither source 135 are directed through sample 130 to detector 115. Thus the signal from the detector includes components proportional to the intensities of the two modulated beams.

The variation of FIG. 8B differs from that of FIG. 8A in that a mechanism other than interferometer 110 is used to modulate the beam from the dither source, designated 135'. As illustrated, a modulator 160, having associated modulator control circuitry 162, modulates the beam from dither source 135' before the beam reaches detector 115. The modulator could be a mechanical chopper or electro-optical device, configured to impose a time varying intensity profile (not a square wave) corresponding to a desired dither whose frequency content is preferably outside the spectral range of interest. Note that in this variation, the dither source can be any radiation source (broadband or narrow band) to which the detector is sensitive since the dither characteristic depends on the modulator, not the wavelength of the dither. This variation has the advantage over the variation illustrated in FIG. 8A that the beam from the dither source does not have to pass through the sample, but has the disadvantage of requiring a separate modulator.

CONCLUSION

In conclusion, it can be seen that the present invention provides a simple technique for increasing the resolution of an A/D converter so as to increase the dynamic range of the measurement system. The invention provides a further benefit in that it tends to average out local non-uniformities in the A/D converter step size.

While the above is a complete description of the preferred embodiments of the invention, various modifications, alternative constructions, and equivalents may be employed. For example, the dither could be put in over a narrow range near the sampling frequency. The dither would fold back around zero frequency in the spectrum, where it could easily be removed. Additionally, with respect to the fourth embodiment, the increased noise can be achieved by a more modest increase in bandwidth coupled with a preamplifier gain that increases with frequency.

Accordingly, the above description and illustrations should not be taken as limiting the scope of the invention which is defined by the appended claims.

What is claimed is:

1. In the operation of a Fourier transform spectrometer where an optical path difference is scanned over a range of values so as to provide a modulated beam of analytical radiation, the range of values defining a scan with the scan being subdivided into a sequence of sampling intervals, a method of digitizing the spectrometer output signal, comprising the steps, carried out for each sampling interval of a scan, of:
   generating an analog signal having a first component representing the intensity of the modulated beam of analytical radiation and a second component representing a dither signal having a time variation;
   sampling the analog signal a plurality of times to provide a plurality of sampled signal values;
   digitizing at least some of the sampled signal values to provide corresponding digitized values; and
   averaging at least some of the digitized values to provide an output value with a digitization error reduced by a factor of up to the square root of the number of values averaged.

2. In the operation of a Fourier transform spectrometer where an optical path difference is scanned over a range of values defining a scan with the scan being subdivided into a sequence of sampling intervals, a method of digitizing the spectrometer output signal, comprising the steps, carried out for each sampling interval of a scan, of:
   sampling the spectrometer output signal to generate an analog signal level whose value equals the value of the spectrometer output signal at the moment of sampling;
   holding the analog signal level during the sampling interval;
   superimposing a dither signal on the analog signal level to provide a dithered signal;
   sampling the dithered signal a plurality of times to provide a plurality of sampled signal values;
   digitizing at least some of the sampled signal values to provide corresponding digitized values; and
   averaging at least some of the digitized values.

3. In the operation of a Fourier transform spectrometer where an optical path difference is scanned over a range of values defining a scan with the scan being subdivided into a sequence of sampling intervals, a method of digitizing the spectrometer output signal, comprising the steps, carried out for each sampling interval of a scan, of:
   superimposing a dither signal on the spectrometer output signal to provide a dithered signal;
   sampling the dithered signal a plurality of times to provide a plurality of sampled signal values;
   digitizing at least some of the sampled signal values, to provide corresponding digitized values; and
   averaging at least some of the digitized values to provide an output value with a digitization error reduced by a factor of up to the square root of the number of values.

4. In the operation of a Fourier transform spectrometer where an optical path difference is scanned over a range of values defining a scan with the scan being subdivided into a sequence of sampling intervals, a method of digitizing the spectrometer output signal, comprising the steps, carried out for each sampling interval of a scan, of:
   sampling the spectrometer output signal;
   superimposing a dither signal on the sampled signal to provide a dithered signal, the dither signal having a time profile during each sampling interval that is characterized by a plurality of rectangular pulses, each defining an interval during which the dither signal is constant;
   digitizing the dithered signal during at least some of the intervals during which the dither signal is constant to provide corresponding digitized values; and
   averaging at least some of the digitized values to provide an output value with a digitization error reduced by a factor of up to the square root of the number of values averaged.

5. In the operation of a Fourier transform spectrometer where an optical path difference is scanned over a range of values defining a scan with the scan being subdivided into a sequence of sampling intervals, a method of digitizing the spectrometer output signal, comprising the steps, carried out for each sampling interval of a scan, of:
   configuring the spectrometer so that its signal channel has a bandwidth that is a significant factor wider than the range of frequencies that characterizes the spectral range of interest of the spectrometer output signal so that the spectrometer output signal provides noise over this bandwidth;

sampling the spectrometer output signal a plurality of times to provide a plurality of sampled values; and digitizing at least some of the sampled values to provide corresponding digitized values.

6. The method of claim 1 wherein all of the sampled signal values are digitized.

7. The method of claim 1 wherein all the digitized values are averaged.

8. The method of claim 1 or 2 or 3 or 4 wherein the dither signal is characterized by a range of frequencies outside the range of frequencies that characterizes the spectral range of interest of the spectrometer output signal.

9. The method of claim 1 or 2 or 3 or 4 or 5 wherein said steps are performed for a plurality of scans, and further comprising the step of averaging the output values generated for corresponding sampling intervals for the plurality of scans.

10. The method of claim 1 or 2 or 3 or 4 wherein at least one characteristic of the dither signal is varied from scan to scan.

11. The method of claim 1 or 2 or 3 or 4 or 5 wherein the spectrometer is operated in a rapid scan mode.

12. The method of claim 1 or 2 or 3 or 4 or 5 wherein the spectrometer is operated in a step scanning mode.

13. The method of claim 1 or 2 or 3 or 4 wherein the dither signal is random noise.

14. The method of claim 1 or 2 or 3 or 4 wherein the dither signal is a periodic waveform.

15. The method of claim 4 wherein the dither signal comprises pulses of random amplitudes.

16. The method of claim 4 wherein the dither signal is a stepped periodic waveform.

17. The method of claim 4 wherein said sampling step is performed once for each sampling interval.

18. The method of claim 4 wherein said sampling step is performed a plurality of times during each sampling interval.

19. The method of claim 5, and further comprising the step of digitally filtering the set of digitized values generated for at least one scan.

20. The method of claim 1 wherein said generating step comprises the substeps of:
generating an analog signal representing the intensity of the modulated beam of analytic radiation; and
superimposing thereon an analog signal having a time variation that defines the time variation of the dither signal.

21. The method of claim 1 wherein said generating step comprises the substeps of:
providing the spectrometer with an auxiliary light source having a time varying intensity that defines the time variation of the dither signal; and
causing the spectrometer to output a signal that includes a component representing the intensity of the auxiliary light source.

22. In a Fourier transform spectrometer where an optical path difference is scanned over a range of values so as to provide a modulated beam of analytical radiation, the range of values defining a scan with the scan being subdivided into a sequence of sampling intervals, apparatus for digitizing the spectrometer output signal, comprising:
means for generating an analog signal having a first component representing the intensity of the modulated beam of analytic radiation and a second component representing a dither signal having a time variation;
sample and hold means, responsive to said analog signal, for providing a plurality of sampled signal values during each sampling interval;
means for digitizing at least some of said sampled signal values to provide corresponding digitized values, said means for digitizing having a characteristic resolution; and
means for averaging at least some of said digitized values for each sampling interval to provide an averaged value having increased resolution relative to said characteristic resolution by a factor of up to the square root of the number of values averaged.

23. In a Fourier transform spectrometer where an optical path difference is scanned over a range of values so as to provide a modulated beam of analytical radiation, the range of values defining a scan with the scan being subdivided into a sequence of sampling intervals, apparatus for digitizing the spectrometer output signal, comprising:
first sample and hold means responsive to the spectrometer output signal, for providing an analog signal level whose value equals the value of the spectrometer output signal at a particular moment for each sampling interval;
means for superimposing a dither signal on said analog voltage level from said first sample and hold means to provide a dithered signal;
second sample and hold means, responsive to said dithered signal, for providing a plurality of sampled signal values during each sampling interval;
means for digitizing at least some of said sampled signal values to provide corresponding digitized values, said means for digitizing having a characteristic resolution; and
means for averaging at least some of said digitized values to provide an averaged value having increased resolution by a factor of up to the square root of the number of values averaged.

24. In a Fourier transform spectrometer where an optical path difference is scanned over a range of values so as to provide a modulated beam of analytical radiation, the range of values defining a scan with the scan being subdivided into a sequence of sampling intervals, apparatus for digitizing the spectrometer output signal, comprising:
means for superimposing a dither signal on the spectrometer output signal to provide a dithered signal;
sample and hold means, responsive to said dithered signal, for providing during each sampling interval a plurality of sampled signal values corresponding to the values of said dithered signal;
means for digitizing at least some of said sampled signal values to provide corresponding digitized values, said digitizing means having a characteristic resolution; and
means for averaging at least some of said digitized values to provide an averaged value having increased resolution by a factor of up to the square root of the number of values averaged.

25. In a Fourier transform spectrometer where an optical path difference is scanned over a range of values so as to provide a modulated beam of analytical radiation, the range of values defining a scan with the scan being subdivided into a sequence of sampling intervals, apparatus for digitizing the spectrometer output signal, comprising:

sample and hold means, responsive to the spectrometer output signal;

means for superimposing a dither signal on the sampled signal from said sample and hold means to provide a dithered signal, said dither signal having a time profile during each sampling interval that is characterized by a plurality of rectangular pulses, each defining an interval during which said dither signal is constant;

means, characterized by a digitizing increment, for digitizing said dithered signal during at least some of the intervals during which said dither signal is constant to provide corresponding digitized values; and means for averaging at least some of said digitized values to provide an averaged value having increased resolution by a factor of up to the square root of the number of values averaged.

26. In a Fourier transform spectrometer where an optical path difference is scanned over a range of values so as to provide a modulated beam of analytical radiation, the range of values defining a scan with the scan being subdivided into a sequence of sampling intervals, apparatus for digitizing the spectrometer output signal, comprising:

sample and hold means, responsive to the spectrometer output signal, for providing during each sampling interval a plurality of sampled signal values corresponding to the values of the spectrometer output signal; and means, characterized by a digitizing increment, for digitizing at least some of said sampled signal values to provide corresponding digitized values;

wherein the spectrometer has a signal channel whose bandwidth is a significant factor wider than the range of frequencies that characterizes the spectral range of interest of the spectrometer output signal so that the spectrometer output signal includes noise over the bandwidth that is of greater amplitude than the noise in the portion of the bandwidth that characterizes the spectral range of interest and the noise in the portion of the bandwidth that characterizes the spectral range of interest is less than said digitizing increment.

27. The apparatus of claim 22 or 23 or 24 or 25 wherein: said digitizing means is an A/D converter having a particular digitization increment; and
said dither signal has maximum fluctuations that exceed said digitization increment.

28. The apparatus of claim 22 or 23 or 24 or 25 wherein said dither signal is characterized by a range of frequencies outside the range of frequencies that characterizes the spectrometer output signal.

29. The apparatus of claim 22 or 23 or 24 or 25 wherein the average value of the dither signal, taken over that portion of each sampling interval that corresponds to those sampled signal values that are averaged, is constant for all sampling intervals in the scan.

30. The apparatus of claim 22 or 23 or 24 wherein said dither signal is random noise.

31. The apparatus of claim 22 or 23 or 24 wherein said dither signal is a periodic waveform.

32. The apparatus of claim 22 or 23 or 24 or 25 wherein at least one characteristic of said dither signal is varied from scan to scan.

33. The apparatus of claim 22 or 23 or 24 or 25 or 26 wherein the spectrometer is operated in a rapid scan mode.

34. The apparatus of 22 or 23 or 24 or 25 or 26 wherein the spectrometer is operated in a step scanning mode.

35. The apparatus of claim 22 or 23 or 24 or 25 wherein the dither signal is characterized by a range of frequencies outside the range of frequencies that characterizes the spectral range of interest of the spectrometer output signal and the average value of the dither signal, taken over that portion of each sampling interval that corresponds to those sampled signal values that are averaged, is constant for all sampling intervals in the scan.

36. The apparatus of claim 22 wherein all of said sampled signal values are digitized.

37. The apparatus of claim 22 wherein all of said digitized values are averaged.

38. The apparatus of claim 25 wherein said sample and hold means is clocked once for each sampling interval.

39. The apparatus of claim 25 wherein said sample and hold means is clocked a plurality of times for each sampling interval.

40. The apparatus of claim 22 wherein said generating means comprises:

means for generating an analog signal representing the intensity of the modulated beam of analytical radiation; and means for superimposing thereon an analog signal having a time variation that defines the time variation of said dither signal.

41. The apparatus of claim 22 wherein said generating means comprises:

an auxiliary light source having a time varying intensity that defines the time variation of said dither signal; and means for generating an analog signal representing a combination of the intensity of the modulated beam of analytical radiation and the intensity of said auxiliary light source.

42. In a method of operating of a Fourier transform spectrometer including the steps of directing a beam of analytical radiation into an interferometer, scanning an optical path difference in the interferometer over a range of positions defining a scan so as to provide a modulated beam of analytical radiation, directing the modulated beam of analytical radiation to a detector, and subdividing the scan into a sequence of sampling intervals, the improvement comprising the steps, carried out for each sampling interval of a scan, of:

illuminating the detector with a modulated auxiliary beam;

generating an analog signal representing a combination of the intensity of the modulated beam of analytical radiation and the intensity of the modulated auxiliary beam;

sampling the analog signal a plurality of times to provide a plurality of sampled signal values;

digitizing at least some of the sampled signal values to provide corresponding digitized values; and averaging at least some of the digitized values to provide an output value with a digitization error reduced by a factor of up to the square root of the number of values averaged.

43. The improvement of claim 42 wherein said illuminating step comprises the substeps of:

providing a narrow band auxiliary source; and directing a beam from the auxiliary source through the interferometer to produce the modulated auxiliary beam.

44. The improvement of claim 42 wherein said illuminating step comprises the substeps of:
providing an auxiliary source; and
modulating the auxiliary source outside the interferometer.

45. In a Fourier transform spectrometer including an interferometer, means for directing a beam of analytical radiation into the interferometer, means for scanning an optical path difference in the interferometer over a range of positions defining a scan so as to provide a modulated beam of analytical radiation, means for directing the modulated beam of analytical radiation to a detector, and means for subdividing the scan into a sequence of sampling intervals, the improvement comprising:
means for illuminating the detector with a modulated auxiliary beam;
means for generating an analog signal representing a combination of the intensity of the modualted beam of analytical radiation and the intensity of said modulated auxiliary beam;
means for sampling the analog signal a plurality of times to provide a plurality of sampled signal values during each sampling interval;
means, having a characteristic resolution, for digitizing at least some of said sampled signal values to provide corresponding digitized values; and
means for averaging at least some of the digitized values provided during each sampling interval to provide an output value with a digitization error reduced by a factor of up to the square root of the number of values averaged.

46. The improvement of claim 45 wherein said means for illuminating comprises:
a narrow band auxiliary source; and
means for directing a beam from said auxiliary source through the interferometer to produce said modulated auxiliary beam.

47. The improvement of claim 45 wherein said means for illuminating comprises:
an auxiliary source; and
means, distinct from the interferometer, for modulating said auxiliary source outside the interferometer.

* * * * *